United States Patent [19]

Shiobara et al.

[11] Patent Number: 5,162,400

[45] Date of Patent: Nov. 10, 1992

[54] EPOXY RESIN COMPOSITIONS AND SEMICONDUCTOR DEVICES ENCAPSULATED THEREWITH

[75] Inventors: Toshio Shiobara, Annaka; Takashi Tsuchiya; Kazutoshi Tomiyoshi, both of Takasaki; Takayuki Aoki, Annaka, all of Japan

[73] Assignee: Shin-Etsu Chemical Co., Ltd., Tokyo, Japan

[21] Appl. No.: 713,841

[22] Filed: Jun. 12, 1991

[30] Foreign Application Priority Data

Jun. 18, 1990 [JP] Japan .................................. 2-160489

[51] Int. Cl.$^5$ .................. C08L 63/02; C08L 63/04; C08K 3/36
[52] U.S. Cl. ............................. 523/466; 528/97; 525/481; 525/482
[58] Field of Search ............... 528/97; 525/481, 482; 523/466

[56] References Cited

FOREIGN PATENT DOCUMENTS

| 0415790 | 3/1991 | European Pat. Off. | ............ 525/481 |
| 62-167318 | 7/1987 | Japan | .................................. 525/481 |
| 63-159419 | 7/1988 | Japan | .................................. 525/481 |
| 3-000717 | 1/1991 | Japan | .................................. 525/481 |
| 2095678 | 10/1982 | United Kingdom | ................ 525/481 |

*Primary Examiner*—John C. Bleutge
*Assistant Examiner*—Christopher P. Rogers
*Attorney, Agent, or Firm*—Birch, Stewart, Kolasch & Birch

[57] ABSTRACT

An epoxy resin composition comprising (A) an epoxy resin having at least two epoxy groups in a molecule, (B) a phenolic resin having at least one naphthalene ring in a molecule, and (C) an inorganic filler has improved flow and cures into products having a low coefficient of expansion, high Tg, and low moisture absorption. The composition is thus suitable for encapsulating semiconductor devices.

11 Claims, 1 Drawing Sheet

EPOXY RESIN COMPOSITIONS AND SEMICONDUCTOR DEVICES ENCAPSULATED THEREWITH

The present invention relates to epoxy resin compositions having improved flow, which when cured form products having a low coefficient of expansion, a high glass transition temperature, and low moisture absorption. Additionally, the present invention relates to semiconductor devices encapsulated with the cured products of such epoxy resin compositions.

BACKGROUND OF THE INVENTION

The mainstream of the modern day semiconductor industry involves resin encapsulated diodes, transistors, IC, LSI, and super LSI. Among various resin compounds for encapsulating semiconductor devices, epoxy resin compositions comprising curable epoxy resins blended with curing agents and various additives are most widely used because they are generally superior in moldability, adhesion, electrical properties, mechanical properties and moisture resistance over the rest of the thermosetting resins. The present day trend for these semiconductor devices is toward an increasingly higher degree of integration and chip size therewith. Packages, on the other hand, are desired to be smaller and thinner in outer dimensions in order to meet the demands of compactness and light weight for electronic equipment. Further, as to the mounting of semiconductor parts on circuit boards, surface packaging of semiconductor parts is now often employed as a means for increasing part density on boards and reducing board thickness.

A common approach to the surface mounting of semiconductor parts is to dip entire semiconductor devices in a solder bath or to pass them through a hot zone of molten solder. Thermal shocks associated with this process cause encapsulating resin layers to crack or incur separation at the interface between the lead frames and chips and the encapsulating resin. Such cracks and separations become more outstanding if the semiconductor device encapsulating resin layers have absorbed moisture prior to the thermal shocks encountered during surface packaging. Since encapsulating resin layers, however, inevitably absorb moisture in practical manufacturing steps, epoxy resin-encapsulated semiconductor devices after packaging sometimes suffer from a loss of reliability.

SUMMARY OF THE INVENTION

The present invention has been made to overcome the problems of the prior art, and its object is to provide a new and improved epoxy resin composition exhibiting improved flow behavior and curing into products having a low coefficient of expansion, low stress, a high glass transition temperature, and low moisture absorption. Another object is to provide a semiconductor device encapsulated with a cured product of the epoxy resin composition which remains fully reliable after thermal shocks during surface packaging.

The inventors have found that by blending (A) an epoxy resin having at least two epoxy groups in a molecule with (B) a curing agent in the form of a phenolic resin having at least one substituted or unsubstituted naphthalene ring in a molecule and (C) an inorganic filler, especially when part or all of epoxy resin (A) is an epoxy resin having at least one substituted or unsubstituted naphthalene ring in a molecule, there is obtained an epoxy resin composition which has improved flow and cures into a product having a low coefficient of expansion and low stress as characterized by a lowering of modulus of elasticity in a temperature range above its glass transition temperature. As opposed to prior art conventional epoxy resin compositions which were obtained by a method designed so as to provide low modulus of elasticity and accompanied by such drawbacks as a lowering of glass transition temperature and a loss of strength, the epoxy resin composition as presently formulated can yield cured products having improved properties which were not found in the conventional epoxy resin compositions; that is, cured products which are free of a lowering of glass transition temperature irrespective of a low modulus of elasticity and absorb little moisture. In addition, semiconductor devices encapsulated with cured products of the presently formulated epoxy resin composition remain highly reliable after the thermal shocks encountered during surface packaging. Therefore, the presently formulated epoxy resin composition is applicable to the encapsulation of semiconductor devices of all types including SOP, SOJ, PLCC and flat pack types since it has quite improved properties as encapsulants for surface packaging semiconductor devices.

Based on the above finding, the present invention provides an epoxy resin composition comprising
(A) an epoxy resin having at least two epoxy groups in a molecule,
(B) a phenolic resin having at least one substituted or unsubstituted naphthalene ring in a molecule, and
(C) an inorganic filler.

BRIEF DESCRIPTION OF THE DRAWING

The only figure.

DESCRIPTION OF THE PREFERRED EMBODIMENTS

Figure 1:
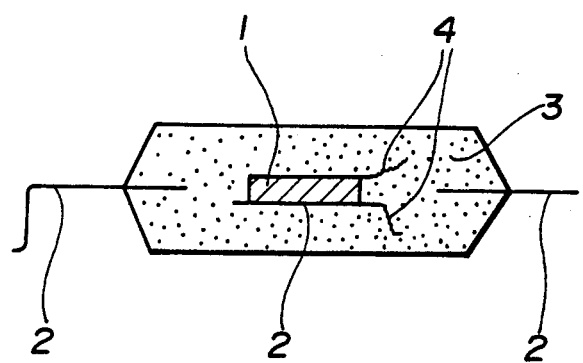
FIG. 1 is a cross sectional view of an SO package in a crack resistance test by soldering after moisture absorption, showing cracks in the package.

As defined above, the epoxy resin composition of the present invention is comprised of (A) an epoxy resin, (B) a phenolic resin, and (C) an inorganic filler.

Component (A) is an epoxy resin having at least two epoxy groups in a molecule. Examples of the epoxy resin include glycidyl ether type epoxy resins such as bisphenol-A type epoxy resins, phenol novolak type epoxy resins and allyl phenol novolak type epoxy resins, triphenol alkane type epoxy resins and polymers thereof, naphthalene type epoxy resins, biphenyl type epoxy resins, dicyclopentadiene type epoxy resins, phenol aralkyl type epoxy resins, glycidyl ester type epoxy resins, cycloaliphatic epoxy resins, heterocyclic epoxy resins, and halogenated epoxy resins. These epoxy resins may be used alone or in admixture of two or more. Preferably in the practice of the present invention, part or all of the epoxy resin (A) is composed of an epoxy resin having at least one substituted or unsubstituted naphthalene ring in a molecule in order to advantageously achieve the purpose of obtaining cured products having a low coefficient of expansion and low moisture absorption.

Illustrative, non-limiting examples of the epoxy resin having a naphthalene ring are given below.

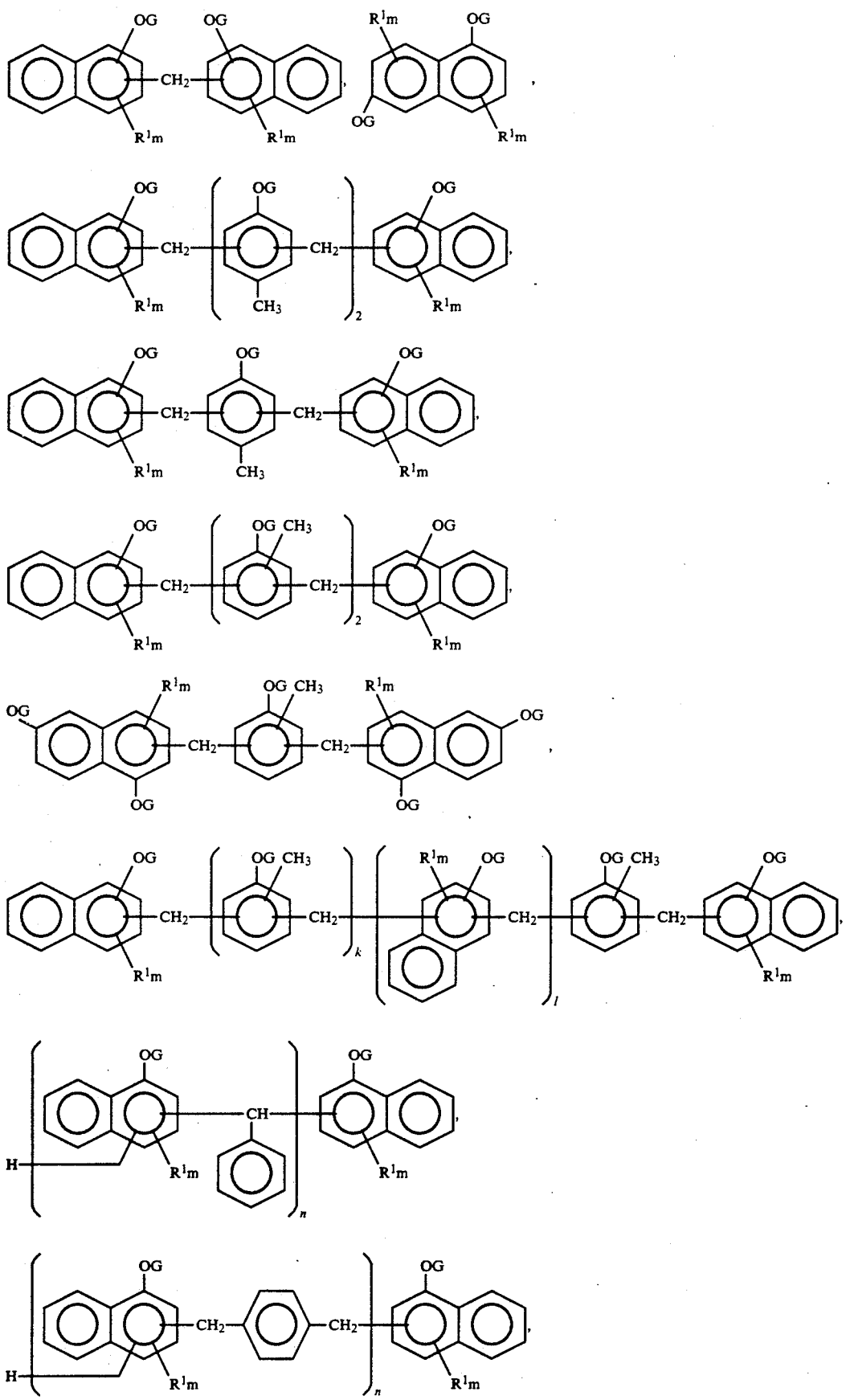

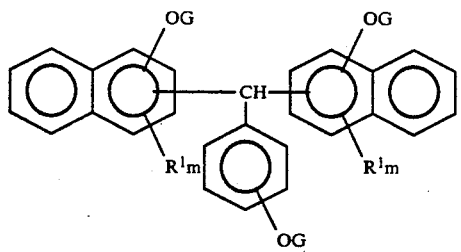

In the formulae, $R^1$ is hydrogen or a monovalent hydrocarbon group having 1 to 5 carbon atoms, such as an alkyl group, OG is

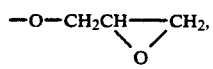

letter m is equal to 1 or 2, k, l, and n each are an integer of at least 1, preferably 1 to 20.

Component (B) is a curing agent for epoxy resin (A), which is a phenolic resin having at least one substituted or unsubstituted naphthalene ring in a molecule. Preferably, the phenolic resin does not contain a silicon atom in the molecule. A blend of an epoxy resin with such a phenolic resin having a naphthalene ring as a curing agent yields cured products having a low coefficient of expansion, a high glass transition temperature, a low modulus of elasticity in a temperature range above the glass transition temperature, and low moisture absorption. Then by using the epoxy resin composition of the invention as an encapsulant for semiconductor devices, the resulting semiconductor devices are improved in crack resistance upon thermal shocks and reliability after thermal shocks.

Illustrative, non-limiting examples of the phenolic resin having a naphthalene ring are given below.

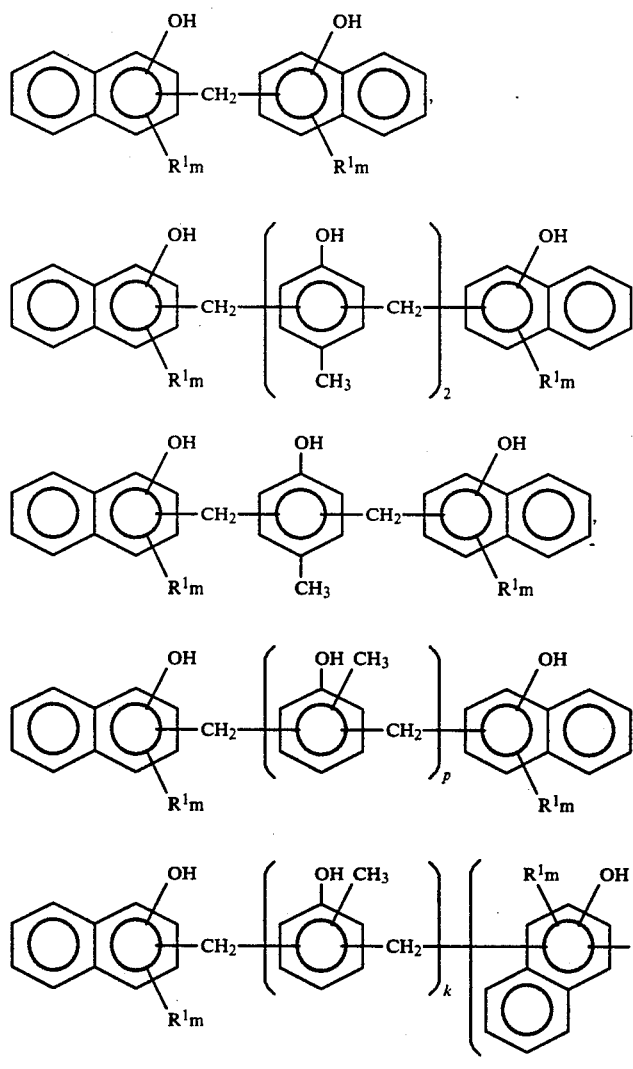

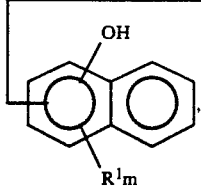

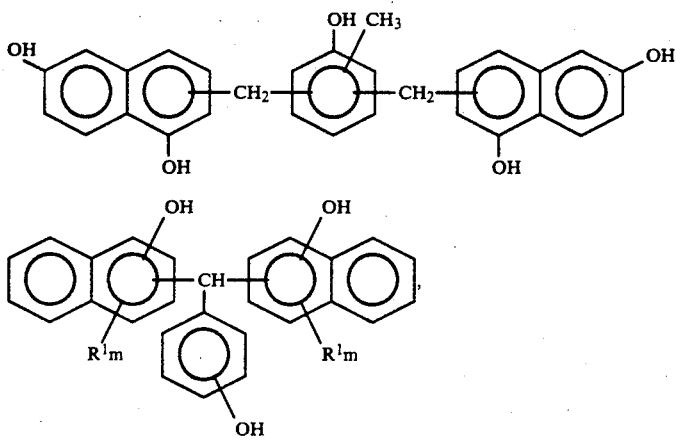

In the formulae, $R^1$, k, l, and m are as defined above, and p is an integer of at least 1, preferably 1 to 20.

In the practice of the invention, these phenolic resins may be used alone or in admixture of two or more as a curing agent for the epoxy resin. If desired, another curing agent may be additionally used in an amount of 0 to 80% by weight of the total amount of component (B). The other curing agents which can be used along with the phenolic resins include phenolic resins such as novolak type phenolic resins, resol type phenolic resins, phenol aralkyl resins, triphenol alkane type resins and polymers thereof; amine curing agents such as diaminodiphenylmethane, diaminodiphenylsulfone, and metaphenylenediamine; and acid anhydride curing agents such as phthalic anhydride, pyromellitic anhydride, and benzophenonetetracarboxylic anhydride.

The content of naphthalene ring in the epoxy resin and the phenolic resin curing agent is preferably 5 to 80% by weight, more preferably 10 to 60% by weight based on the total weight of the epoxy and phenolic resins. With a naphthalene ring content of less than 5% by weight, the resulting cured products would be less improved in crack resistance upon thermal shocks after moisture absorption since the moisture absorption and the modulus of elasticity in a temperature range above the glass transition temperature are insufficiently reduced. With a naphthalene ring content of more than 80% by weight, problems will arise with respect to dispersion upon preparation and moldability.

Component (B) may be used in an amount of 50 to 150 parts by weight per 100 parts by weight of component (A). Desirably, components (A) and (B) contain epoxy and phenolic hydroxyl groups in such quantities that the ratio of the quantity of epoxy group (a mol) to the quantity of phenolic hydroxyl group (b mol), a/b, ranges from ½ to 3/2. Outside the range, curing property and low stress are sometimes lost.

Component (C) is an inorganic filler which may be selected from those commonly used for epoxy resins. Examples include silicas such as fused silica and crystalline silica, alumina, carbon black, mica, clay, kaoline, glass beads, glass fibers, aluminum nitride (AlN), zinc white, antimony trioxide, calcium carbide, aluminum hydroxide, beryllium oxide (BeO), boron nitride (BN), titanium oxide, silicon carbide (SiC), iron oxide or the like. These inorganic fillers may be used alone or in admixture of two or more. The filler is preferably used in an amount of 100 to 1,000 parts, especially 200 to 700 parts by weight per 100 parts by weight of the total of components (A) and (B) although the filler content is not particularly limited.

A curing catalyst may be blended in the epoxy resin composition of the invention. The curing catalysts used herein include imidazoles, tertiary amines, and phosphorus compounds. The preferred curing catalysts are mixtures of 1,8-diazabicyclo(5.4.0)undecene-7 and triphenylphosphine in a weight ratio of from 0:1 to 1:1, especially from 0.01:1 to 0.5:1. A higher proportion of 1,8-diazabicyclo(5.4.0)-undecene-7 beyond this range would sometimes lead to a lower glass transition temperature. The amount of the curing catalyst added is not particularly limited although it is preferably added in an amount of 0.2 to 2 parts, more preferably 0.4 to 1.2 parts by weight per 100 parts, more preferably 0.4 to 1.2 parts by weight per 100 parts by weight of the total of components (A) and (B).

The composition of the invention may further contain various well-known additives if desired. Exemplary additives include stress lowering agents such as thermoplastic resins, thermoplastic elastomers, organic synthetic rubbers, and silicones; mold release agents such as waxes (e.g., carnauba wax) and fatty acids (e.g., stearic acid) and metal salts thereof; pigments such as carbon black, cobalt blue, and red iron oxide; flame retardants such as antimony oxide and halides; surface treating agents such as γ-glycidoxypropyltrimethoxy-silane; coupling agents such as epoxysilanes, vinylsilanes, boron compounds and alkyl titanates; antioxidants, other additives, and mixtures thereof.

The epoxy resin compositions of the invention may be prepared by mixing and agitating the necessary components uniformly, and milling the mixture in milling means preheated at 70° to 95° C., for example, a kneader, roll mill and extruder, followed by cooling and comminution. The order of mixing the components is not critical.

The compositions of the invention are advantageously applicable in encapsulating various types of semiconductor device including SOP, SOJ, PLCC, and flat pack types. The compositions can be molded by conventional methods including transfer molding, injection molding, and casting. Most often, the epoxy resin compositions are molded at a temperature of about 150° to about 180° C. and post cured at a temperature of about 150° to about 180° C. for about 2 to about 16 hours.

The epoxy resin compositions of the invention comprising the specific components in admixture as defined above flow well and cure into low stressed products having a low modulus of elasticity, a low coefficient of expansion, a high glass transition temperature (irrespective of low stress), and low moisture absorption. Therefore, the semiconductor devices encapsulated with the epoxy resin compositions are highly reliable even after being subject to thermal shocks upon surface packaging.

EXAMPLE

Examples of the present invention are given below together with comparative examples, by way of illustration and not by way of limitation. All parts are by weight.

EXAMPLES 1-8 AND COMPARATIVE EXAMPLES 1-3

Epoxy resin compositions were prepared by uniformly melt mixing the following components in a hot two-roll mill, cooling and comminuting the mixture. The components used were an epoxy resin and a phenolic resin both shown below and used in the amounts shown in Table 1, 0.6 parts of a curing catalyst shown below, 0.5 parts of triphenylphosphine, 250 parts of quartz powder (I), 250 parts of quartz powder (II), 70 parts of quarts powder (III) shown below, 8 parts of $Sb_2O_3$, 1.5 parts of carbon black, 1 part of carnauba wax, and 3 parts of γ-glycidoxypropyltrimethoxysilane.

| Epoxy resin | Epoxy equiv. | Softening point |
|---|---|---|
| (I) [structure: naphthalene–OG, CH₂, phenyl(OG,CH₃), CH₂, naphthalene–OG] | 215 | 70 |
| (II) Cresol novolak type epoxy resin EOCN - 1020 - 65 (Nihon Kayaku K.K.) | 198 | 65 |
| (III) Triphenolalkane type epoxy resin EPPN - 501 (Nihon Kayaku K.K.) | 164 | 58 |
| (IV) Brominated epoxy resin BREN - S (Nihon Kayaku K.K.) | 280 | 80 |

| Phenolic resin | OH equiv. |
|---|---|
| (I) [structure: naphthalene–OH, CH₂, phenyl(OH,CH₃), CH₂, naphthalene–OH] | 142 |
| (II) [structure: naphthalene–OH, CH₂, (phenyl(OH,CH₃)–CH₂)₂, naphthalene–OH] | 139 |
| (III) [structure: dihydroxynaphthalene, CH₂, phenyl(OH,CH₃), CH₂, dihydroxynaphthalene] | 85 |

(IV) 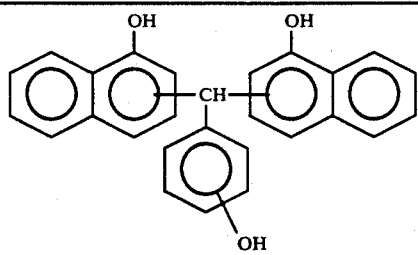 126

(V) Phenol novolak resin KH3988 (Dai - Nihon Ink K.K.)     110

Curing catalyst

It was prepared by mixing 1,8-diazabicyclo(5.4.0)undecene-7 and phenol novolak resin TD2131 (manufactured by Dai-Nihon Ink K.K.) in a weight ratio of 20/80, heat melting them at 130° C. for 30 minutes, and atomizing to a size of less than 50 μm.

Quartz powders (I) Spherical fused silica having a specific surface area of 1.4 m²/g and a mean particle size of 15 μm (the content of coarse particles of more than 75 μm being less than 0.1 wt %).

(II) Ground fused silica having a specific surface area of 2.5 m²/g and a mean particle size of 10 μm (the content of coarse particles of more than 75 μm being 0.1 wt %).

(III) Spherical fused silica having a specific surface area of 10 m²/g and a mean particle size of 1.0 μm.

For these compositions, the following tests (A) to (F) were carried out. The results are shown in Table 1.

(A) Spiral flow

Using a mold according to the EMMI standard, measurement was made at 180° C. and 70 kg/cm².

(B) Flexural strength and Flexural modulus

Test bars of 10×4×100 mm which were molded at 180° C. and 70 kg/cm² for 2 minutes and post cured at 180° C. for 4 hours were tested at 215° C. according to JIS K6911.

(C) Coefficient of linear expansion (μ) and Glass transition temperature (Tg)

Using a dilatometer, test pieces of 4 mm in diameter and 15 mm long were examined by heating the test pieces at a rate of 5° C./min.

(D) Crack resistance upon soldering after moisture absorption

Silicon chips of 2×4×0.4 mm were bonded to SO frames of 4×12×1.8 mm and then encapsulated with the epoxy resin compositions by molding at 175° C. for 2 minutes and post curing at 180° C. for 4 hours. The packages were allowed to stand in a hot humid atmosphere at 85° C. and RH 85% for 24 and 48 hours and then immersed for 10 seconds in a solder bath at 240° C. Then the packages were disintegrated to observe the occurrence of internal cracks. Reported is the number of cracked packages/the total number of packages tested.

FIG. 1 shows the package used in this test as comprising a silicon chip 1, a frame 2, and an encapsulating resin 3. Cracks 4 develop in the resin 3.

(E) Moisture resistance

4-M DRAM chips were bonded to SOJ frames with 20 pins and then encapsulated with the epoxy resin compositions by molding at 180° C. for 2 minutes and post curing at 180° C. for 4 hours. The packages were allowed to stand for 24 hours in a hot humid atmosphere at 121° C. and RH 100%, then dipped for 10 seconds in a solder bath at 260° C., and again allowed to stand for 300 hours in a hot humid atmosphere at 121° C. and RH 100%. Reported is the number of Al wire broken packages/the total number of packages tested.

(F) Water absorption

Disks of 50 mm in diameter and 2 mm thick were molded at 180° C. and 70 kg/cm² for 2 minutes and post cured at 180° C. for 4 hours. The disks were subjected to a pressure cooker test (PCT) at 121° C./100% RH for 24 hours before the water absorption (percent) was measured.

TABLE 1

|  | Example | | | | | | | | Comparative Example | |
|---|---|---|---|---|---|---|---|---|---|---|
|  | 1 | 2 | 3 | 4 | 5 | 6 | 7 | 8 | 1 | 2 |
| Epoxy resin (I) | — | — | — | — | — | — | 26.6 | 54.1 | — | — |
| Epoxy resin (II) | 52.4 | 52.9 | 63.7 | 55.1 | 55.7 | — | 26.6 | — | 58.2 | — |
| Epoxy resin (III) | — | — | — | — | — | 48.3 | — | — | — | 54.3 |
| Epoxy resin (IV) | 8 | 8 | 8 | 8 | 8 | 8 | 8 | 8 | 8 | 8 |
| Phenolic resin (I) | 39.6 | — | — | — | 18.1 | 43.7 | 38.8 | 37.9 | — | — |
| Phenolic resin (II) | — | 39.1 | — | — | — | — | — | — | — | — |
| Phenolic resin (III) | — | — | 28.3 | — | — | — | — | — | — | — |
| Phenolic resin (IV) | — | — | — | 36.9 | — | — | — | — | — | — |
| Phenolic resin (V) | — | — | — | — | 18.1 | — | — | — | 33.8 | 37.7 |
| Naphthalene ring content*, wt % | 23.8 | 18.0 | 17.0 | 25.0 | 10.9 | 26.3 | 33.9 | 44.2 | 0 | 0 |
| Spiral flow, inch | 34 | 34 | 34 | 34 | 34 | 34 | 35 | 36 | 33 | 32 |
| Flexural strength, kg/mm | 1.9 | 1.9 | 1.9 | 1.9 | 2.0 | 2.1 | 1.9 | 1.9 | 2.2 | 2.2 |
| Flexural modulus, kg/mm | 160 | 170 | 170 | 160 | 180 | 155 | 130 | 100 | 200 | 225 |
| Tg, °C. | 165 | 168 | 172 | 169 | 165 | 183 | 172 | 176 | 165 | 180 |
| μ, 10⁻⁵/°C. | 1.35 | 1.35 | 1.35 | 1.35 | 1.37 | 1.35 | 1.30 | 1.25 | 1.40 | 1.40 |
| Crack resistance 85° C./85% RH 24 hr | 0/20 | 0/20 | 0/20 | 0/20 | 0/20 | 0/20 | 0/20 | 0/20 | 20/20 | 20/20 |
| resistance 85° C./85% RH 48 hr | 0/20 | 0/20 | 0/20 | 0/20 | 2/20 | 0/20 | 0/20 | 0/20 | — | — |
| Moisture resistance | 0/40 | 0/40 | 0/40 | 0/40 | 3/40 | 0/40 | 0/40 | 0/40 | 40/40 | 40/40 |

TABLE 1-continued

| | Example | | | | | | | | Comparative Example | |
|---|---|---|---|---|---|---|---|---|---|---|
| | 1 | 2 | 3 | 4 | 5 | 6 | 7 | 8 | 1 | 2 |
| Water absorption, %* | 0.42 | 0.42 | 0.43 | 0.42 | 0.47 | 0.44 | 0.41 | 0.40 | 0.52 | 0.69 |

*based on the total weight of epoxy and phenolic resins.

As seen from Table 1, the compositions within the scope of the present invention are free flowing and cure to products having low modulus of elasticity, a low coefficient of expansion, high Tg, and minimized water absorption. Then the semiconductor devices encapsulated with the present compositions have improved crack resistance upon soldering after moisture absorption and moisture resistance and remain highly reliable even after being subject to thermal shocks upon surface packaging.

Although some preferred embodiments have been described, many modifications and variations may be made thereto in the light of the above teachings. It is therefore to be understood that within the scope of the appended claims, the invention may be practiced otherwise than as specifically described.

We claim:

1. An epoxy resin composition, comprising:
   (A) an epoxy resin having at least two epoxy groups in a molecule,
   (B) a phenolic resin selected from the group consisting of

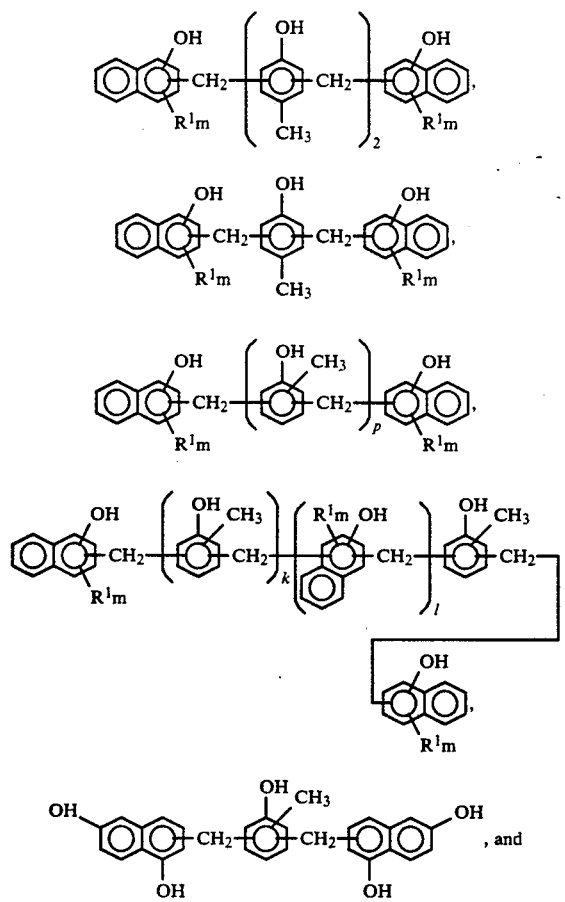

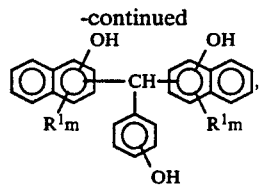

wherein $R^1$ represents hydrogen or a monovalent hydrocarbon group having 1–5 carbon atoms, m is 1 or 2, and k, l, and p each represent an integer from 1 to 20, and
   (C) an inorganic filler.

2. The epoxy resin composition of claim 1, wherein at least a portion of epoxy resin (A) is an epoxy resin having at least one substituted or unsubstituted naphthalene ring in a molecule.

3. The epoxy resin composition of claim 2, wherein epoxy resin (A) is an epoxy resin having at least one substituted or unsubstituted naphthalene ring in a molecule.

4. The epoxy resin composition of claim 1, wherein phenolic resin (B) contains 5 to 80% by weight of naphthalene ring.

5. The epoxy resin composition of claim 2, wherein the epoxy resin having a naphthalene ring contains 5 to 80% by weight of naphthalene ring.

6. The epoxy resin composition of claim 1, wherein components (A) and (B) contain epoxy and phenolic hydroxyl groups in such quantities that the molar ratio of epoxy group to phenolic hydroxyl group ranges from ½ to 3/2.

7. The epoxy resin composition of claim 1, wherein 100 to 1,000 parts by weight of filler (C) is present per 100 parts by weight of components (A) and (B) combined.

8. A semiconductor device encapsulated with the epoxy resin composition of any one of claims 1 to 7 in cured state.

9. The epoxy resin composition of claim 1, wherein the weight ratio of phenolic resin (B) to epoxy resin (A) ranges from 50:100 to 150:100.

10. The epoxy resin composition of claim 1, wherein the naphthalene ring content in the epoxy resin and phenolic resin ranges from 5 to 80% by weight, based on the total weight of the epoxy and phenolic resins.

11. An epoxy resin composition, comprising:
   (A) at least two epoxy resins, each having at least two epoxy groups in a molecule;
   (B) a phenolic resin selected from the group consisting of

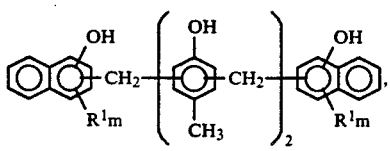

-continued
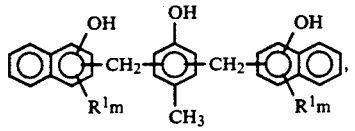
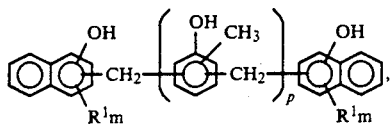
-continued
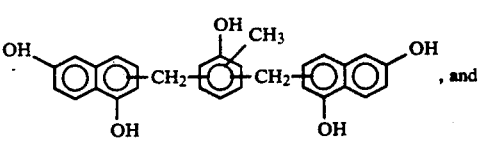
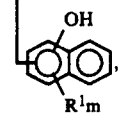
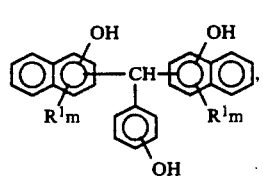
, and
wherein $R^1$ represents hydrogen or a monovalent hydrocarbon group having 1-5 carbon atoms, m is 1 or 2, and k, l, and p each represent an integer from 1 to 20; and
(C) an inorganic filler,
wherein the naphthalene ring content in the epoxy resins and phenolic resin ranges from 5 to 80% by weight based on the total weight of the epoxy and phenolic resins.
* * * * *